(12) United States Patent
Shin et al.

(10) Patent No.: US 9,761,691 B2
(45) Date of Patent: Sep. 12, 2017

(54) INTEGRATED CIRCUITS INCLUDING REPLACEMENT GATE STRUCTURES AND METHODS FOR FABRICATING THE SAME

(71) Applicant: GLOBALFOUNDRIES, Inc., Grand Cayman (KY)

(72) Inventors: Dong-Woon Shin, Saratoga Springs, NY (US); Min-Hwa Chi, Malta, NY (US); Xusheng Wu, Ballston Lake, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 144 days.

(21) Appl. No.: 14/560,054

(22) Filed: Dec. 4, 2014

(65) Prior Publication Data

US 2016/0163824 A1   Jun. 9, 2016

(51) Int. Cl.
*H01L 29/66* (2006.01)
*H01L 29/78* (2006.01)
*H01L 29/49* (2006.01)
*H01L 29/51* (2006.01)

(52) U.S. Cl.
CPC .. *H01L 29/66545* (2013.01); *H01L 29/66553* (2013.01); *H01L 29/66636* (2013.01); *H01L 29/7848* (2013.01); *H01L 29/4966* (2013.01); *H01L 29/517* (2013.01)

(58) Field of Classification Search
CPC .......... H01L 29/66545; H01L 29/6656; H01L 29/66636; H01L 29/7848
See application file for complete search history.

(56) References Cited

U.S. PATENT DOCUMENTS

| | | | | |
|---|---|---|---|---|
| 2011/0309429 | A1* | 12/2011 | Kiyotoshi | B82Y 30/00 257/321 |
| 2014/0124874 | A1* | 5/2014 | Mehrotra | H01L 21/28114 257/410 |
| 2015/0263128 | A1* | 9/2015 | Basker | H01L 29/6681 257/288 |
| 2016/0093726 | A1* | 3/2016 | Ching | H01L 29/785 257/192 |

* cited by examiner

*Primary Examiner* — Errol Fernandes
(74) *Attorney, Agent, or Firm* — Lorenz & Kopf, LLP

(57) ABSTRACT

Integrated circuits and methods for fabricating integrated circuits are provided. In one example, a method for fabricating an integrated circuit includes forming sidewall spacer structures laterally adjacent to a dummy gate structure that overlies a semiconductor substrate. Additional sidewall spacer structures are formed laterally adjacent to the sidewall spacer structures and under lower portions of the sidewall spacer structures. The dummy gate structure is replaced with a replacement gate structure.

14 Claims, 11 Drawing Sheets

INTEGRATED CIRCUITS INCLUDING REPLACEMENT GATE STRUCTURES AND METHODS FOR FABRICATING THE SAME

TECHNICAL FIELD

The technical field relates generally to integrated circuits and methods for fabricating integrated circuits, and more particularly relates to integrated circuits with improved replacement gate structures and methods for fabricating such integrated circuits.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. The ICs are usually formed using both P-channel FETs (PMOS transistors or PFETs) and N-channel FETs (NMOS transistors or NFETs) and the IC is then referred to as a complementary MOS or CMOS circuit. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the device size decreases.

In some integrated circuit designs there has been a desire to eliminate the use of polysilicon gate electrodes to improve device performance with decreased feature sizes. Replacing polysilicon gate structures with metal gate stacks is one solution. A typical metal gate stack includes a metal gate that overlies a high dielectric constant (high-K) dielectric layer on a semiconductor substrate. One approach to forming metal gate stacks employs a process known as replacement gate or replacement metal gate (RMG). The replacement gate process forms a dummy gate structure that is used to self-align source and drain implants and anneals in a semiconductor substrate. The dummy gate structure is then removed and replaced with the high-K and metal gate materials.

Additionally, it is known that the introduction of strain in semiconductor devices can enhance carrier mobility and therefore enhance drive current capabilities of such devices. For example, and not intending to be limiting, with a PFET, it is known that the use of source and drain regions formed of silicon-germanium (SiGe) alloy can provide compressive strain in the channel region located between the source and drain regions of the MOS device. This strain can increase carrier mobility in the channel region and significantly improve overall device properties. However, some practical difficulties may be encountered in implementing such structures particularly when using a replacement gate process to form the MOS device. For example, and not intending to be limiting, various cleaning and/or etching steps during the replacement gate process can result in the strain-inducing source and drain regions being too close to the metal gate edges, which can result in shorting or loss between the strain-inducing source and drain regions and the metal gate.

Accordingly, it is desirable to provide integrated circuits and methods of forming integrated circuits with improved replacement gate structures. Furthermore, other desirable features and characteristics of the present invention will become apparent from the subsequent detailed description and the appended claims, taken in conjunction with the accompanying drawings and this background.

BRIEF SUMMARY

Integrated circuits and methods for fabricating integrated circuits are provided herein. In accordance with an exemplary embodiment, a method for fabricating an integrated circuit includes forming sidewall spacer structures laterally adjacent to a dummy gate structure that overlies a semiconductor substrate. Additional sidewall spacer structures are formed laterally adjacent to the sidewall spacer structures and under lower portions of the sidewall spacer structures. The dummy gate structure is replaced with a replacement gate structure.

In accordance with another exemplary embodiment, a method for fabricating an integrated circuit is provided. The method includes forming a dummy gate structure overlying a semiconductor substrate. The dummy gate structure includes a dummy gate insulation layer overlying the semiconductor substrate and a dummy gate electrode overlying the dummy gate insulation layer. Sidewall spacer structures are formed laterally adjacent to the dummy gate structure. At least a portion of outer lateral sections of the dummy gate insulation layer is removed to form undercuts that extend under the sidewall spacer structures. A spacer forming material is deposited along outer sidewall surfaces of the sidewall spacer structures and in the undercuts for forming additional sidewall spacer structures. Cavities are formed in the semiconductor substrate laterally adjacent to the additional sidewall spacer structures on sides opposite to the sidewall spacer and dummy gate structures. A strain-inducing material is deposited in the cavities to form strain-inducing regions. The dummy gate structure is removed to form a recess between the sidewall spacer structures. A replacement gate structure is formed in the recess.

In accordance with another exemplary embodiment, an integrated circuit is provided. The integrated circuit includes a semiconductor substrate. A replacement gate structure overlies the semiconductor substrate. Sidewall spacer structures are disposed laterally adjacent to the replacement gate structure. Additional sidewall spacer structures are disposed laterally adjacent to the sidewall spacer structures and under lower portions of the sidewall spacer structures. Strain-inducing regions are disposed in the semiconductor substrate laterally adjacent to the sidewall spacer and additional sidewall spacer structures on sides opposite to the replacement gate structure.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to integrated circuits and methods for fabricating integrated circuits. The exemplary embodiments taught herein include forming sidewall spacer structures laterally adjacent to a dummy gate structure that overlies a semiconductor substrate. Additional sidewall spacer structures are formed laterally adjacent to the sidewall spacer structures. These additional sidewall spacer structures also extend under lower portions of the sidewall spacer structures. The dummy gate structure is replaced with a replacement gate structure. In an exemplary embodiment, the replacement gate structure includes a metal gate that overlies a high dielectric constant (high-K) dielectric layer. Strain-inducing regions are arranged in the semiconductor substrate laterally adjacent to the sidewall spacer and additional sidewall spacer structures on sides opposite to the replacement gate structure. In an exemplary embodiment, it has been found that by adding the additional sidewall spacer structures that extend along sidewalls and under lower portions of the sidewall spacer, isolation between the metal gate and the strain-inducing regions is improved even after exposure to various replacement gate process steps such as cleaning, etching, and/or the like, thereby reducing or eliminating the likelihood of shorting or loss between the strain-inducing regions and the metal gate.

FIGS. 1-22 illustrate, in cross-sectional view, an integrated circuit (IC) 10 during various fabrication stages. The described process steps, procedures, and materials are to be considered only as exemplary embodiments designed to illustrate to one of ordinary skill in the art methods for practicing the invention; the invention is not limited to these exemplary embodiments. Various steps in the manufacture of ICs are well known and so, in the interest of brevity, many conventional steps will only be mentioned briefly herein or will be omitted entirely without providing the well-known process details.

Figure 1:
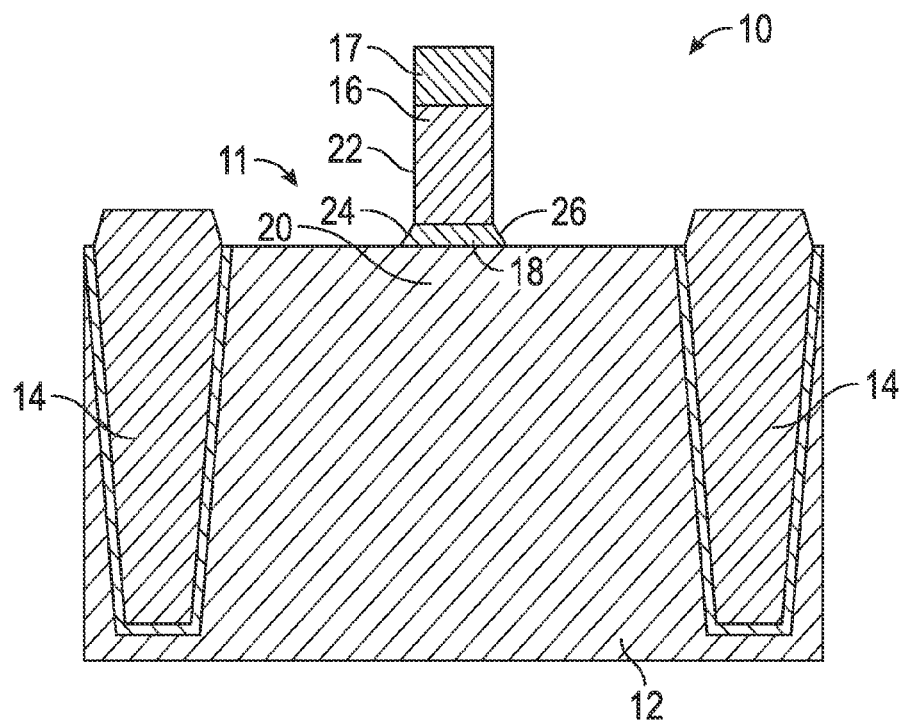
FIGS. 1-22 illustrate, in cross-sectional views, an integrated circuit and methods for fabricating an integrated circuit during various intermediate fabrication stages in accordance with exemplary embodiments.

FIG. 1 illustrates a portion of the IC 10 during an intermediate fabrication stage in accordance with an exemplary embodiment. The IC 10 includes a region 11 of a semiconductor substrate 12. As used herein, the term 'semiconductor substrate' will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. An exemplary semiconductor material is a silicon substrate. The silicon substrate may be a bulk silicon wafer or may be a thin layer of silicon on an insulating layer (commonly known as silicon-on-insulator or SOI) that, in turn, is supported by a carrier wafer.

The region 11 of the semiconductor substrate 12 is electrically isolated from neighboring regions of the semiconductor substrate 12 by performing shallow trench isolation (STI) or another isolation process to form insulating structures 14. The insulating structures 14 are formed of an insulating material, such as silicon dioxide or the like.

As illustrated, a dummy gate structure 16 is disposed on the region 11 of the semiconductor substrate 12 between the insulating structures 14. On top of the dummy gate structure 16 is a patterned hard mask layer 17 formed of silicon nitride or the like. The dummy gate structure 16 includes a dummy gate insulation layer 18 that is disposed over a channel region 20 of the semiconductor substrate 12 and a dummy gate electrode 22 that overlies the dummy gate insulation layer 18.

In an exemplary embodiment, the dummy gate insulation layer 18 has outer lateral sections 24 and 26 that are inclined flaring outwardly towards the semiconductor substrate 12. In an exemplary embodiment, such inclined regions (e.g., outer lateral sections 24 and 26) are due to the etch selectivity difference between the dummy gate electrode 16 and the gate insulator layer 18. The dummy gate insulation layer 18 can be a layer of thermally grown silicon dioxide, or alternatively, a deposited insulator such as a silicon dioxide, silicon nitride, or the like that is subsequently patterned and etched. In an exemplary embodiment, the dummy gate insulation layer 18 is formed of an oxide material (e.g., silicon dioxide). The deposited insulator can be deposited, for example, by chemical vapor deposition (CVD), low pressure chemical vapor deposition (LPCVD), or plasma enhanced chemical vapor deposition (PECVD). In an exemplary embodiment, the dummy gate insulation layer 18 has a thickness of from about 1 to about 5 nm.

The dummy gate electrode 22 may be formed by depositing, for example, a layer of polycrystalline silicon, such as a layer of undoped polycrystalline silicon and patterning and etching the layer using the patterned hard mask layer 17 as an etch mask to form the dummy gate electrode 22. In an exemplary embodiment, the dummy gate electrode 22 has a thickness of from about 30 to about 100 nm. The polycrystalline silicon can be deposited, for example, by the reduction of silane in a CVD reaction.

Figure 2:
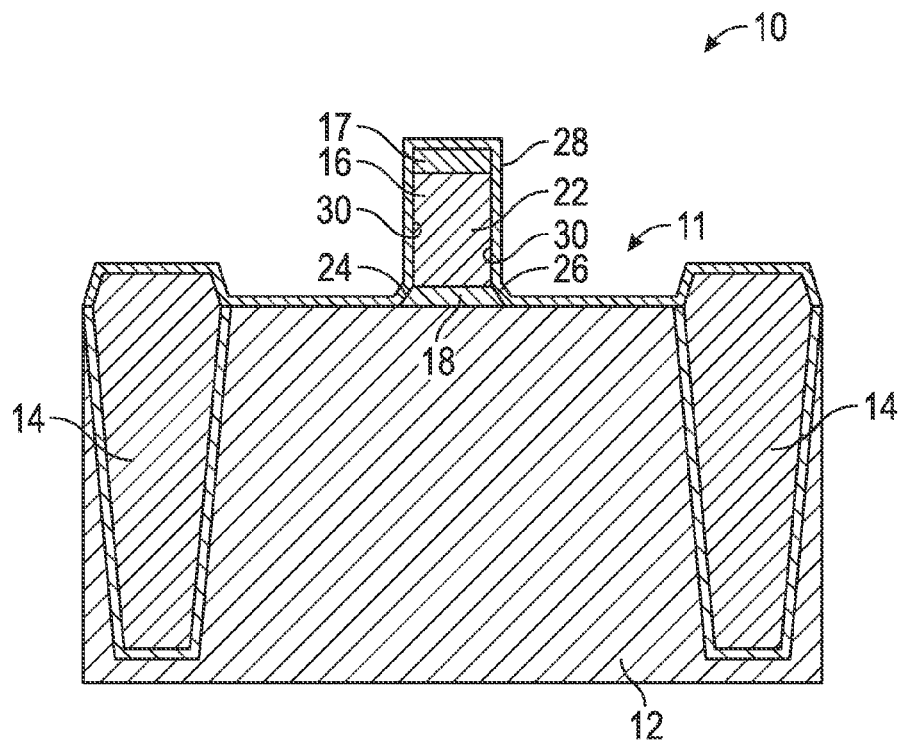
Figure 3:
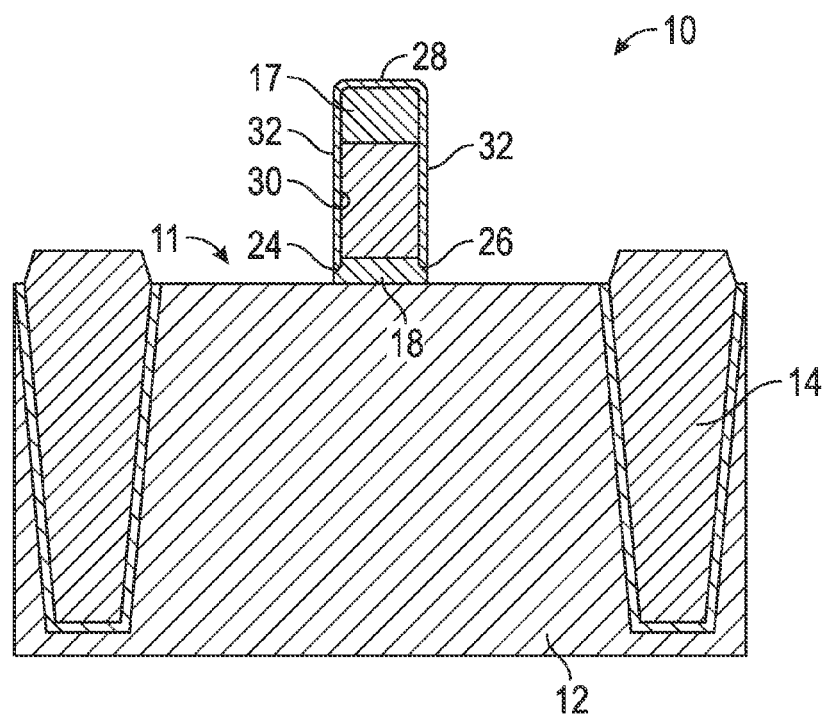

The process continues as illustrated in FIGS. 2-3 by depositing a spacer forming material 28 overlying the dummy gate structure 16 including on sidewalls 30 of the dummy gate electrode 22 and on the outer lateral sections 24 and 26 of the dummy gate insulation layer 18, the patterned hard mask layer 17, and exposed portions of the region 11 of the semiconductor substrate 12. In an exemplary embodiment, the spacer forming material 28 is a nitride material (e.g., silicon nitride). Alternatively, the spacer forming material 28 may be formed from another insulating or dielectric material(s) known to those skilled in the art, such as, for example, silicon dioxide, or low dielectric (low-k) material or the like. The spacer forming material 28 is then selectively etched to remove portions of the spacer forming material 28 that overlie portions of the region 11 of the semiconductor substrate 12 laterally adjacent to the dummy gate structure 16 and to form sidewall spacer structures 32 along the sidewalls 30 of the dummy gate structure 16. In an exemplary embodiment, due in part to the inclined surfaces of the outer lateral sections 24 and 26, the spacer forming material 28 is selectively etched such that at least a portion of the outer lateral sections 24 and 26 are not covered by the sidewall spacer structures 32 but rather are exposed. The spacer forming material 28 may be anisotropically etched, for example, by reactive ion etching (RIE) in a $CHF_3$, $CF_4$, or $SF_6$ chemistry.

Figure 4:
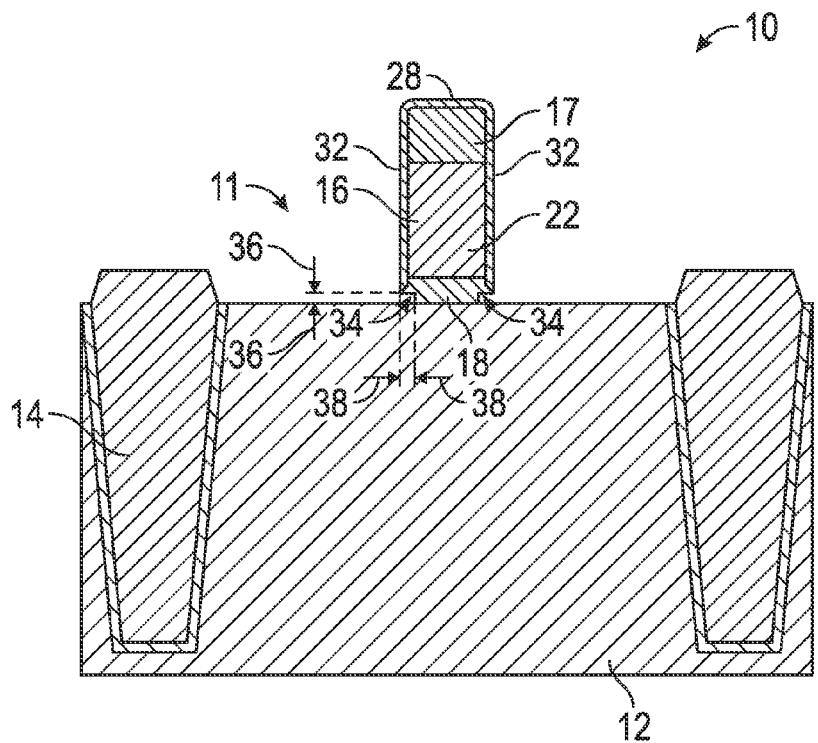

FIG. 4 illustrates, in cross-sectional view, the integrated circuit 10 during a further advanced fabrication stage in accordance with an exemplary embodiment. Referring to FIGS. 3-4, at least portions of the outer lateral sections 24 and 26 of the dummy gate insulation layer 18 are etched to form undercuts 34 that extend under the sidewall spacer structures 32. In an exemplary embodiment, a selective etching process that favors removing the oxide material over removing the nitride material is used to remove at least portions of the outer lateral sections 24 and 26 to form the undercuts 34 while substantially leaving the sidewall spacer structures 32 intact. In an exemplary embodiment, the selective etching process uses a fluorine based chemistry such as a wet etching process with an aqueous HF etchant or a dry etching process such as a RIE process with $CF_4H_2$ etching gas to form the undercuts 34. In an exemplary embodiment, the undercuts 34 have a height (indicated by arrows 36) of from about 1 to about 5 nm, such as from about 1 to about 3 nm, and extend into the dummy gate insulation layer 18 a distance (indicated by arrows 38) of from about 1 to about 5 nm.

Figure 5:
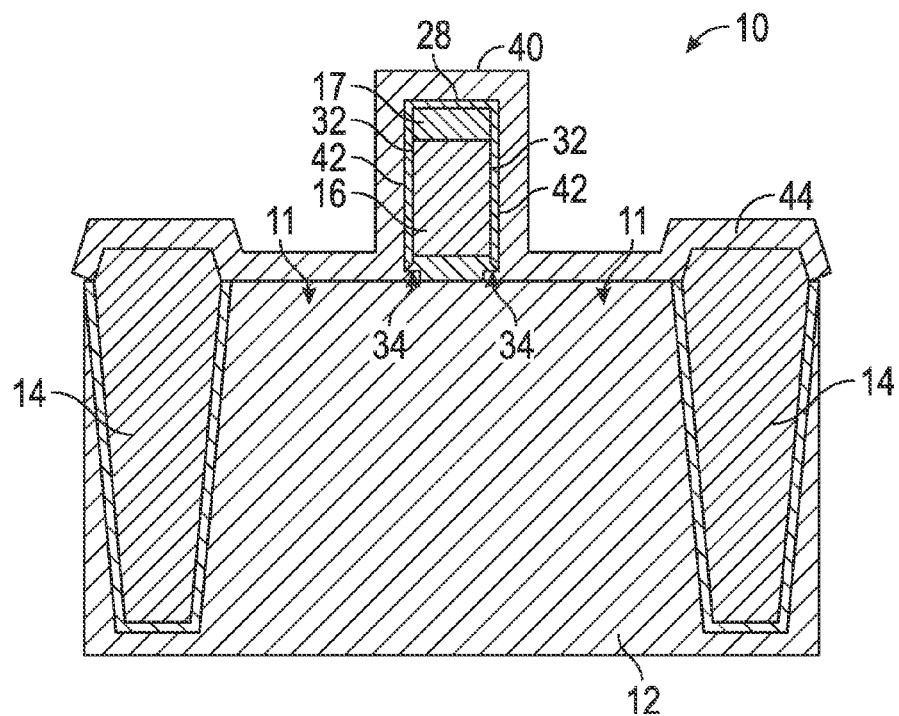
Figure 6:
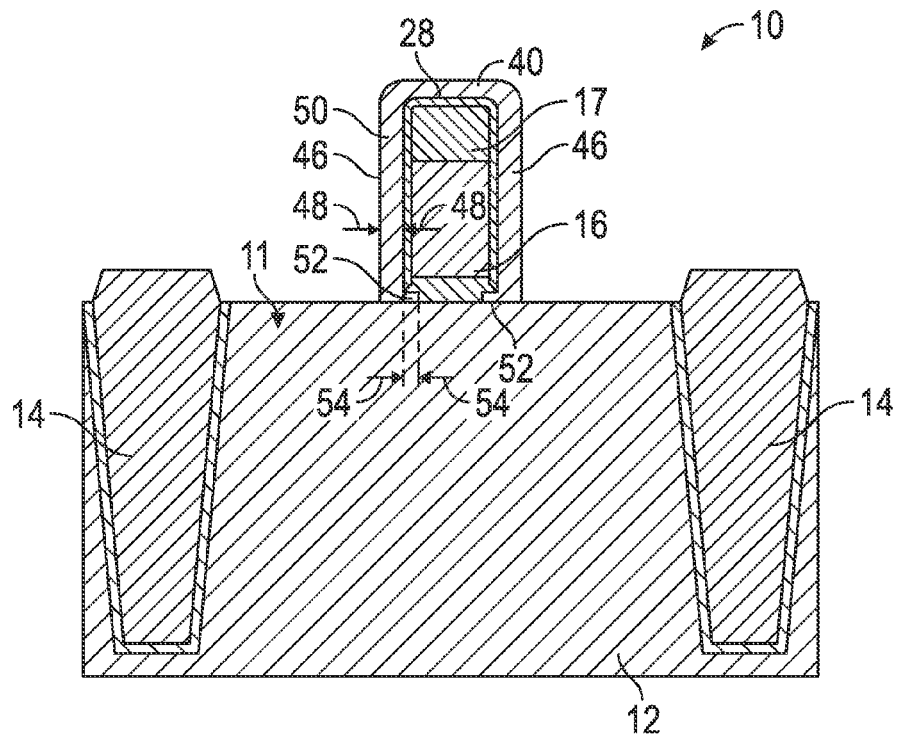

The process continues as illustrated in FIGS. 5-6 by depositing a spacer forming material 40 over exposed portions of the region 11 of the semiconductor substrate 12, along outer sidewall surfaces 42 of the sidewall spacer structures 32, and in the undercuts 34 under the sidewall spacer structures 32 to form a layer 44 of spacer forming material 40. In an exemplary embodiment, the spacer forming material 40 is deposited using an atomic layer deposition (ALD) process. In an exemplary embodiment, the spacer forming material 40 is a nitride material (e.g., silicon nitride). Alternatively, the spacer forming material 40 may be formed from another insulating or dielectric material(s) known to those skilled in the art, such as, for example, silicon dioxide, or low dielectric (low-k) material or the like.

In an exemplary embodiment, the layer 44 of spacer forming material 40 is selectively etched using an anisotropic etching process to remove portions of the spacer forming material 40 that overlie the semiconductor substrate 12 while leaving portions of the spacer forming material 40 along the outer sidewall surfaces 42 of the sidewall spacer structures 32 and in the undercuts 34 intact to form additional sidewall spacer structures 46. As illustrated in FIG. 6, in an exemplary embodiment, the additional sidewall spacer structures 46 have an "L-shaped" cross-section and a mirror image thereof cross-section, respectively. In an exemplary embodiment, the additional sidewall spacer structures 46 have a thickness (indicated by arrows 48), for example, along a leg portion 50 of the "L-shaped" cross-section of from about 1 to about 5 nm and have a foot portion 52 that extends from the leg portion 50 into the undercuts 34 a distance (indicated by arrows 54) of from about 1 to about 5 nm.

Figure 7:
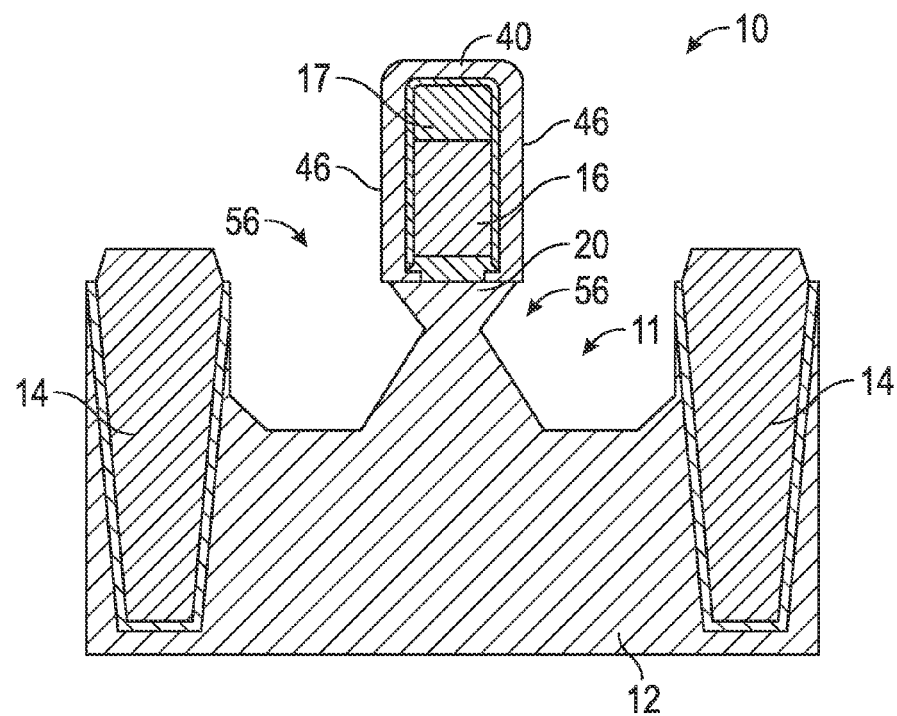

FIG. 7 illustrates, in cross-sectional view, the integrated circuit 10 during a further advanced fabrication stage in accordance with an exemplary embodiment. Using the additional sidewall spacer structures 46 and a remaining portion of the spacer forming material 40 that overlies the dummy gate structure 16 as an etch mask, cavities 56 are etched into the region 11 of the semiconductor substrate 12 laterally adjacent to the additional sidewall spacer structures 46 on sides opposite to the dummy gate and sidewall spacer structures 16 and 32. In one example, the cavities 56 are formed using two etching steps in which the first etching step forms box-shaped cavities (not shown) on the basis of a substantially anisotropic etch behavior accomplished using a dry etching process, such as a plasma assisted etch, for example RIE. The box-shaped cavities are further etched to define the cavities 56 as sigma-shaped cavities on the basis of a substantially isotropic etch behavior accomplished using a wet etching process. In an exemplary embodiment, the wet etching process includes tetra-methyl ammonium hydroxide (TMAH) as an etchant.

Figure 8:
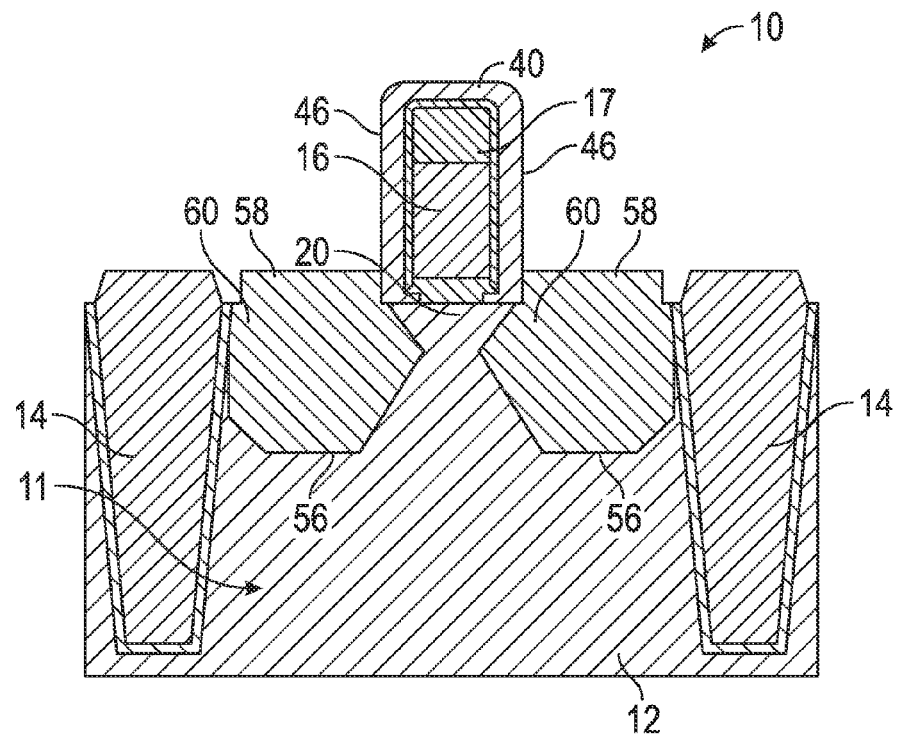

FIG. 8 illustrates, in cross-sectional view, the integrated circuit 10 during a further advanced fabrication stage in accordance with an exemplary embodiment. The region 11 of the semiconductor substrate 12 is exposed to a selective epitaxial growth process to correspondingly deposit a strain-inducing material 58 in the cavities 56, and optionally above the cavities 56, to form strain-inducing regions 60. The selective epitaxial growth process may be established on the basis of a silicon and germanium-containing precursor gas or gases and appropriate process parameters to obtain a selective deposition of a silicon-germanium alloy or alloys within the cavities 56 while substantially avoiding a material deposition on the dielectric surfaces, such as the additional sidewall spacer structures 46 and the remaining portion of the spacer forming material 40 that overlies the dummy gate structure 16. Alternatively, the selective epitaxial growth process may be established on the basis of a silicon and carbon-containing precursor gas or gases and appropriate process parameters to obtain a selective deposition of a silicon-carbon alloy or alloys within the cavities 56. In an exemplary embodiment, the configuration of the cavities 56 as sigma-shaped cavities brings the strain-inducing regions 60 (e.g., source and drain regions) closer together to enhance the localized strain in the channel region 20 to further improve the strain (e.g., compressive strain for example in the case of SiGe for PMOS devices or tensile strain for example in the case of SiC for NMOS devices) and carrier mobility in the channel region 20.

Figure 9:
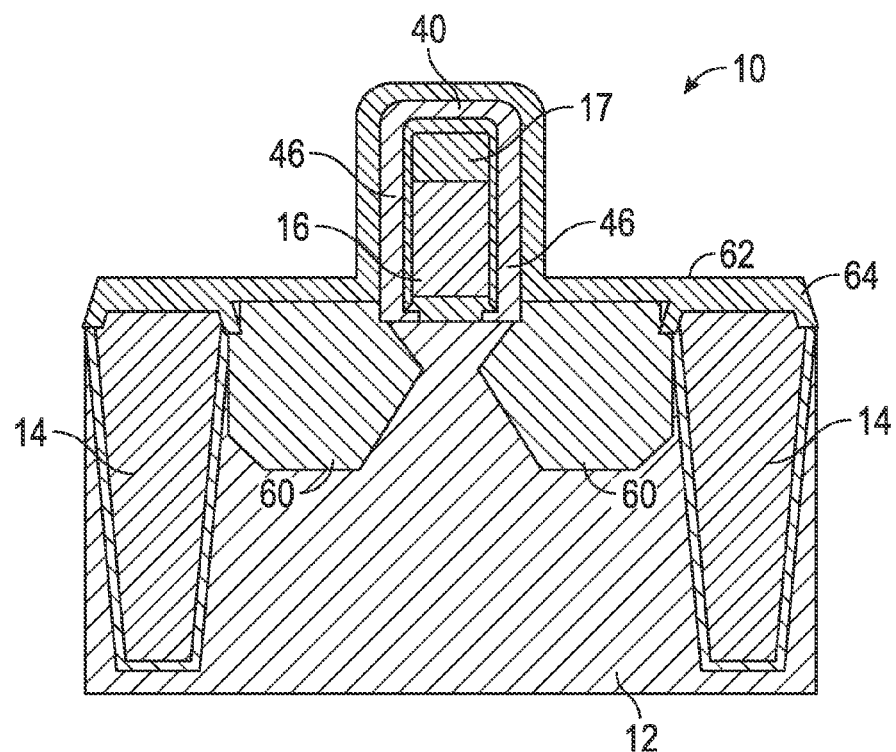

The process continues as illustrated in FIG. 9 by depositing a layer 62 of encapsulation material 64 overlying the strain-inducing regions 60, the additional sidewall spacer structures 46, and the remaining portion of the spacer forming material 40 that overlies the dummy gate structure 16. In an exemplary embodiment, the encapsulation material 64 includes silicon nitride or silicon dioxide.

Figure 10:
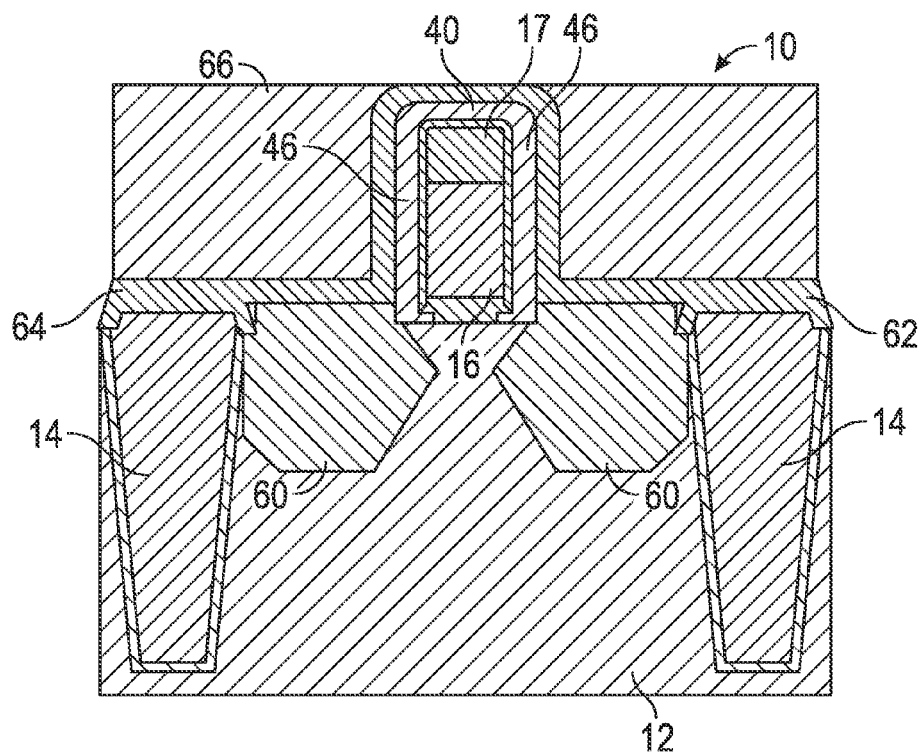
Figure 11:
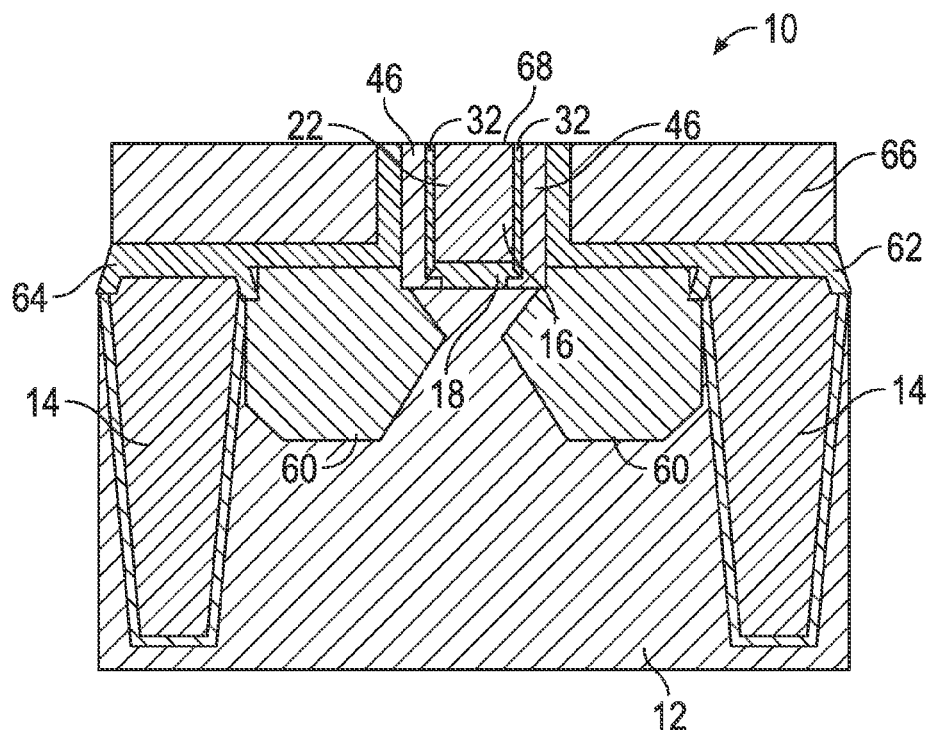

FIGS. 10-11 illustrate, in cross-sectional views, the integrated circuit 10 during further advanced fabrication stages in accordance with an exemplary embodiment. An interlayer dielectric (ILD) layer 66 is formed overlying the layer 62 of encapsulation material 64 including over the strain-inducing regions 60, the additional sidewall spacer structures 46, and the remaining portion of the spacer forming material 40 that overlies the dummy gate structure 16. In an exemplary embodiment, the ILD layer 66 includes silicon dioxide and may be formed by means of a CVD process or a plasma-enhanced CVD process in which tetraethyl orthosilicate (TEOS) is used as a reactant. After the formation of the ILD layer 66, a planarization process, for example a chemical mechanical polishing (CMP) process, may be performed for providing a substantially planar surface along the ILD layer 66 and across portions of the layer 62 of the encapsulation material 64, the additional sidewall spacer structures 46, the sidewall spacer structures 32, and the dummy gate structure 16, and further, for exposing an upper surface 68 of the dummy gate structure 16.

Figure 12:
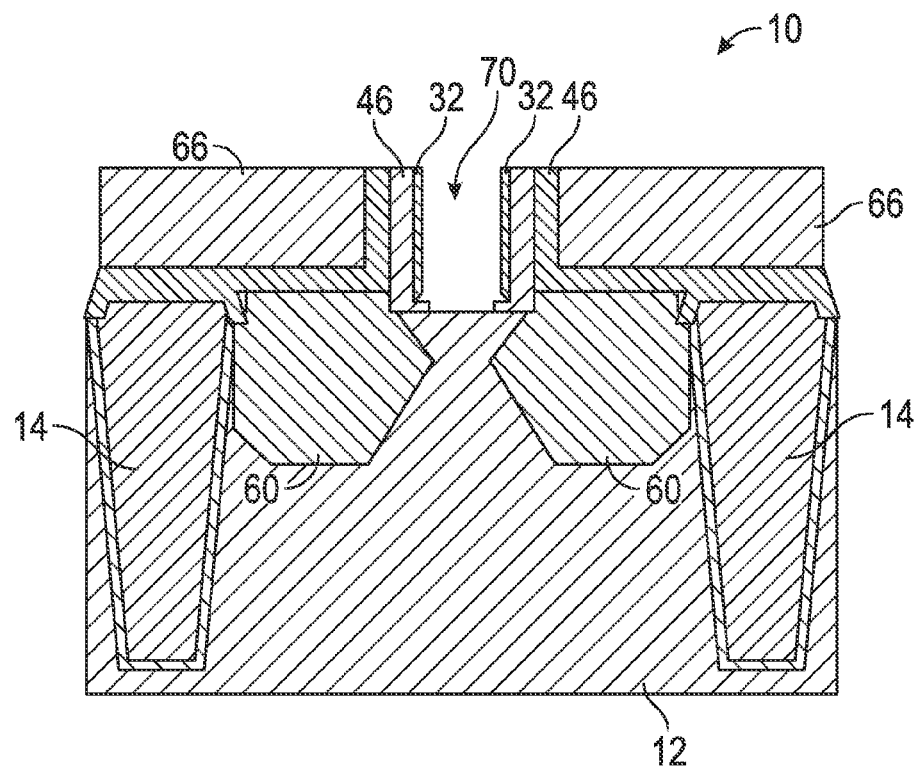

In an exemplary embodiment and with reference to FIGS. 11-12, the process continues by exposing the upper surface 68 of the dummy gate structure 16 to an etching process to remove the dummy gate structure 16 and form a recess 70 between the sidewall spacer and additional sidewall spacer structures 32 and 46. This may be done, for example, by means of a first etch process adapted to selectively remove the material of the dummy gate electrode 22 relative to the material or materials of the ILD layer 66, the layer 62 of the encapsulation material 64, the additional sidewall spacer structures 46, and the sidewall spacer structures 32, and a second etch process adapted to selectively remove the material of the dummy gate insulation layer 18 relative to the material of the semiconductor substrate 12.

Figure 13:
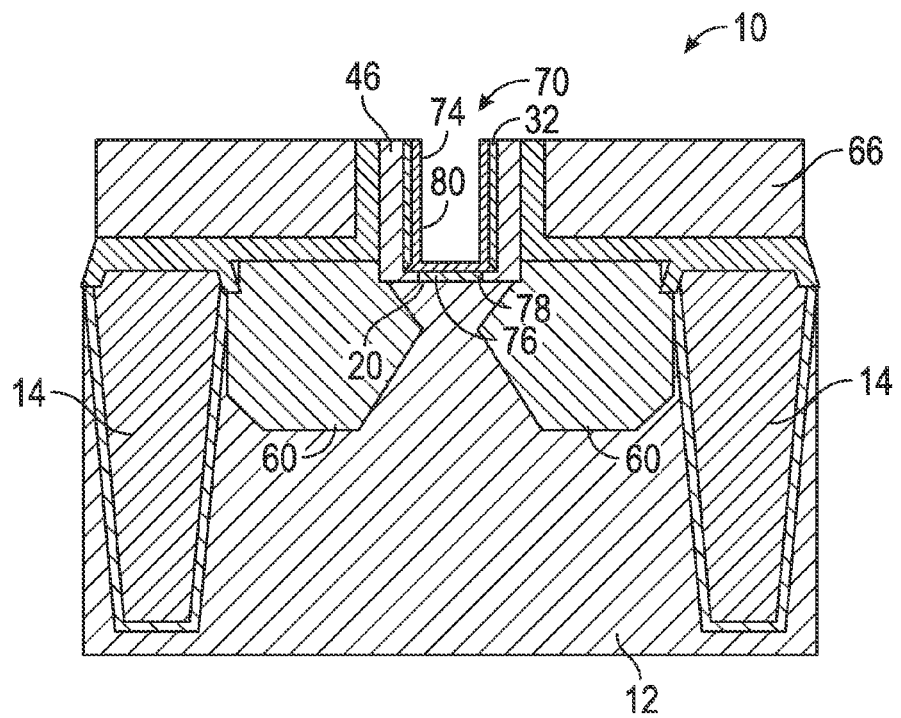

The process continues as illustrated in FIG. 13 by forming a replacement gate structure 74 that includes a high-K dielectric layer 78 and a metal gate 80 in the recess 70. In an exemplary embodiment, the replacement gate structure 74 is formed by depositing a high-K dielectric material 76 overlying the ILD layer 66, the inner surfaces of the sidewall spacer structures 32 including under the inner surfaces, and the exposed portion of the channel region 20 of the semiconductor substrate 12 and selectively etching the high-K dielectric material 76 to form the high-K dielectric layer 78. The high-K dielectric material 76 may be deposited by an ALD process, a CVD process, or the like. In an exemplary embodiment, the high-K dielectric layer 78 has a thickness of from about 0.1 to about 3 nm and the high-K dielectric material 76 includes hafnium oxide, hafnium silicate, zirconium oxide, or hafnium aluminum oxide. In an exemplary embodiment, the high-K dielectric layer 78 is formed of hafnium dioxide ($HfO_2$). In an exemplary embodiment, the high-K dielectric layer 78 is annealed at a temperature of from about 750 to about 950° C. In an exemplary embodiment, in addition, prior to the high-k material deposition, it may be accompanied by a thin interlayer (IL) for the purpose of high-k reliability and structural compatibility to the channel 20 material.

The metal gate 80 is formed overlying the high-K dielectric layer 78 using one or more deposition processes, such as a physical vapor deposition (PVD) process, CVD process, an ALD process, or the like. Depending upon the desired function of the device, the metal gate 80 may include one or more work function layers, such as a P-type work function metal layer and/or an N-type work function metal layer as are known in the art. A low resistance layer (not shown) of, for example, aluminum (Al) or tungsten (W), may deposited over the metal gate 80 in a remaining portion of the recess 70 using, for example, a CVD process or the like. In an exemplary embodiment, the work function metal layer(s) may include titanium nitride (TiN), titanium aluminum (TiAl), or the like. Additionally, a barrier/liner layer(s) such as titanium nitride/tantalum nitride (TiN/TaN) may be deposited prior to the work function layer. The upper surface of the IC 10 may be planarized by a CMP process. As illustrated, in an exemplary embodiment, the additional sidewall spacer structures 46 are disposed along the sidewalls of the sidewall spacer structures 32 and extend under the lower portions of the sidewall spacer structures 32 to improve isolation between the metal gate 80 and the strain-inducing regions 60 to help reduce or eliminate the possibility of shorting or loss between the strain-inducing regions 60 and the metal gate 80.

Figure 14:
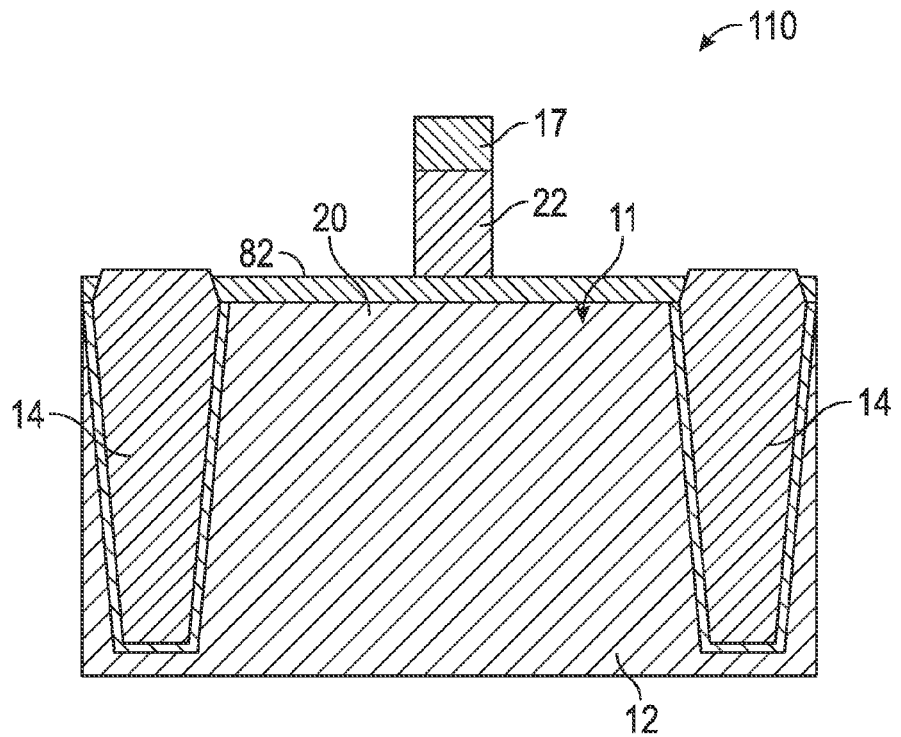

FIG. 14 illustrates a portion of an IC 110 during an intermediate fabrication stage in accordance with an exemplary embodiment. The IC 110 is similarly configured to the IC 10 as illustrated in FIG. 1 including a region 11 of a semiconductor substrate 12, insulating structures 14, a channel region 20, a dummy gate electrode 22, and a patterned hard mask layer 17 but with the exception that the dummy gate electrode 22 is disposed on an oxide layer 82 that substantially covers the region 11 of the semiconductor substrate 12. In particular, the oxide layer 82 can be a layer of thermally grown silicon dioxide, or alternatively, a deposited insulator of silicon dioxide that is formed overlying the region 11 of the semiconductor substrate 12. The deposited insulator can be deposited, for example, by CVD, LPCVD, or PECVD. In an exemplary embodiment, the oxide layer 82 has a thickness of from about 1 to about 5 nm.

The dummy gate electrode 22 may be formed by depositing, for example, a layer of polycrystalline silicon, such as a layer of undoped polycrystalline silicon, overlying the oxide layer 82 and patterning and etching the polycrystalline silicon layer using the patterned hard mask layer 17 as an etch mask to form the dummy gate electrode 22. In an exemplary embodiment, the dummy gate electrode 22 has a thickness of from about 30 to about 100 nm. The polycrystalline silicon can be deposited, for example, by the reduction of silane in a CVD reaction.

Figure 15:
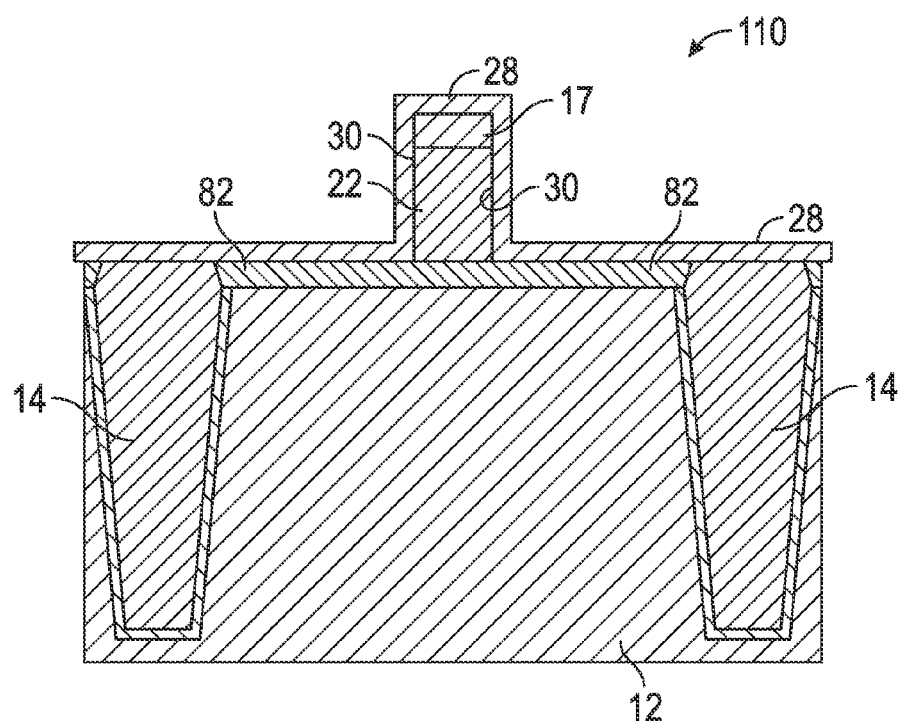
Figure 16:
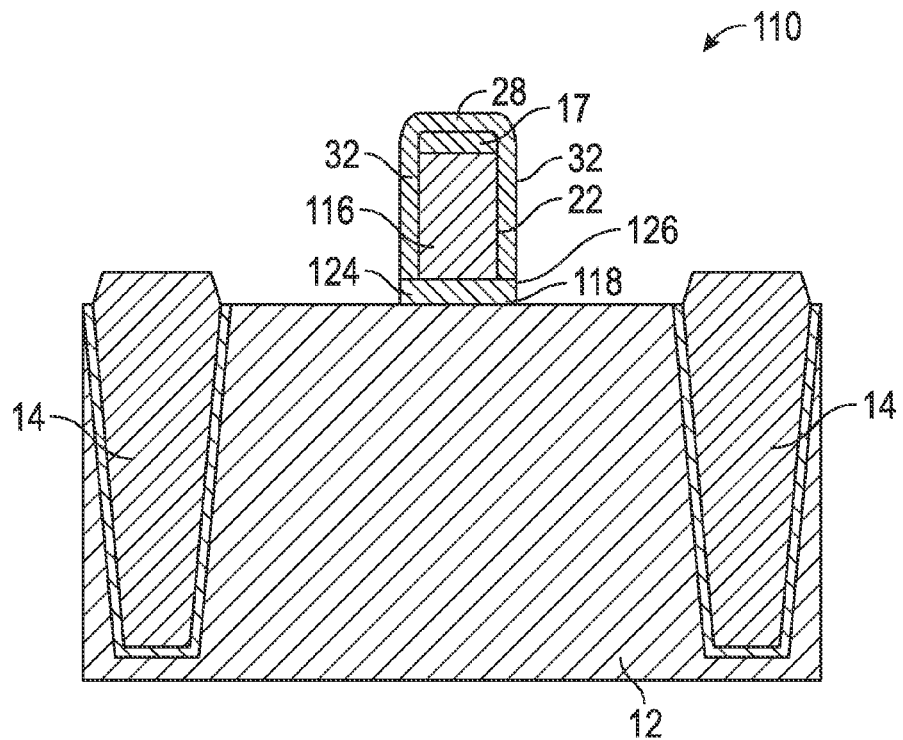

The process continues as illustrated in FIGS. 15-16 by depositing a spacer forming material 28 (e.g., a nitride material such as silicon nitride) overlying the sidewalls 30 of the dummy gate electrode 22, the patterned hard mask layer 17, and the exposed portions of the oxide layer 82. Portions of the spacer forming material 28 laterally adjacent to the dummy gate electrode 22 are then removed to form sidewall spacer structures 32 along the sidewalls 30 of the dummy gate electrode 22. Additionally, in an exemplary embodiment, portions of the oxide layer 82 that are laterally adjacent to the dummy gate electrode 22 are removed leaving a remaining portion of the oxide layer 82 which forms a dummy gate insulation layer 118 that is disposed under the dummy gate electrode 22 and the sidewall spacer structures 32. Together the dummy gate electrode 22 and the dummy gate insulation layer 118 form a dummy gate structure 116. Removing the portions of the spacer forming material 28 and the oxide layer 82 may be done, for example, by means of a first etch process adapted to anisotropically etch to form the sidewall spacer structures 32, and a second etch process adapted to selectively remove the material of the oxide layer 82 relative to the spacer forming material 28 to form the dummy gate insulation layer 118. As illustrated, in an exemplary embodiment, outer lateral sections 124 and 126 of the dummy gate insulation layer 118 have vertically oriented surfaces that are fully exposed.

Figure 17:
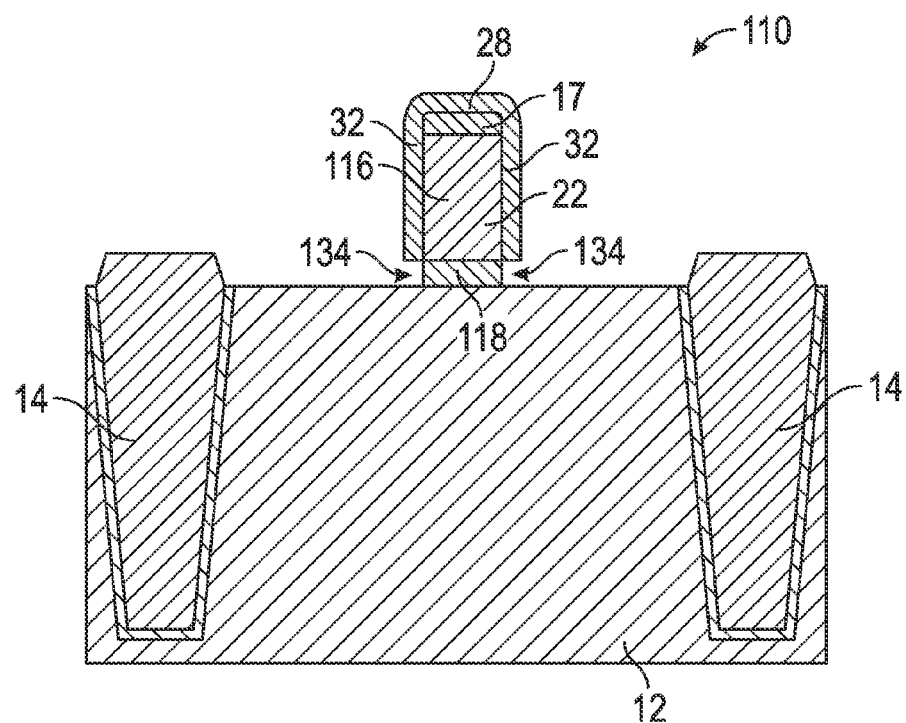

FIG. 17 illustrates, in cross-sectional view, the IC 110 during a further advanced fabrication stage in accordance with an exemplary embodiment. Referring to FIGS. 16-17, the outer lateral sections 124 and 126 of the dummy gate insulation layer 118 are etched to form undercuts 134 that extend under the sidewall spacer structures 32. In an exemplary embodiment, a selective etching process that favors removing the oxide material over removing the nitride material is used to remove the outer lateral sections 124 and 126 to form the undercuts 134 while substantially leaving the sidewall spacer structures 32 intact. In an exemplary embodiment, the selective etching process uses a fluorine based chemistry such as a wet etching process with an aqueous HF etchant or a dry etching process such as a RIE process with $CF_4H_2$ etching gas to form the undercuts 34. In an exemplary embodiment, the undercuts 134 have a height of from about 1 to about 5 nm, such as from about 2 to 4 nm, and extend into the dummy gate insulation layer 118 a distance of from about 1 to about 5 nm. Next, the IC 110 is exposed to the same or similar process steps as discussed in relation to the IC 10 as illustrated in FIGS. 5-13 to form the IC 110 similarly configured to the IC 10 as illustrated in FIG. 13.

Figure 18:
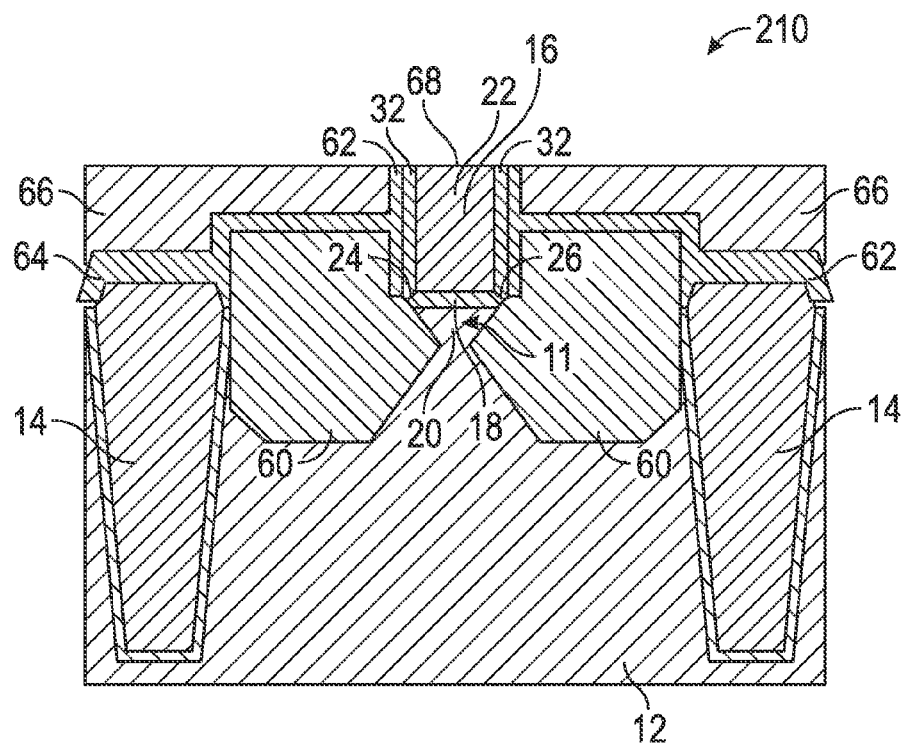

FIG. 18 illustrates a portion of the IC 210 during an intermediate fabrication stage in accordance with an exemplary embodiment. The IC 210 is similarly configured to the IC 10 as illustrated in FIG. 11 including a region 11 of a semiconductor substrate 12, insulating structures 14, a channel region 20, a dummy gate structure 16 including a dummy gate insulation layer 18 with inclined outer lateral sections 24 and 26 and a dummy gate electrode 22, strain-inducing regions 60, a layer 62 of encapsulation material 64, and an ILD layer 66 but with the exception that the sidewall spacer structures 32 are in direct contact with the layer 62 of the encapsulation material 64 without an interposing additional spacer structure being formed therebetween.

Figure 19:
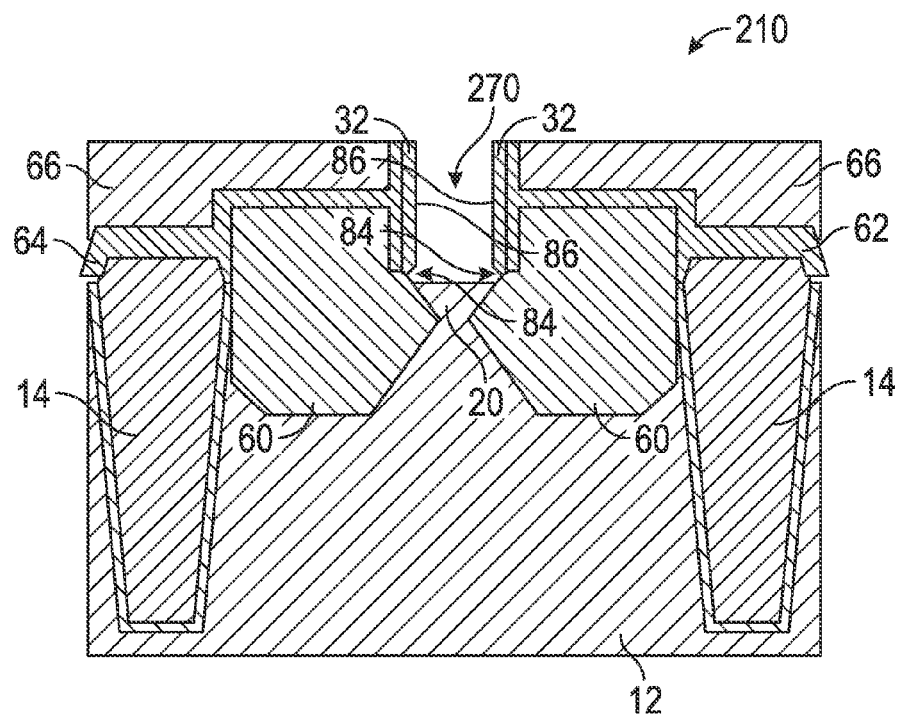

The process continues as illustrated in FIGS. 18-19 by exposing an upper surface 68 of the dummy gate structure 16 to an etching process to remove the dummy gate structure 16 and form a recess 270 between the sidewall spacer structures 32. As illustrated, in an exemplary embodiment, the recess 270 exposes a portion of the channel region 20 of the semiconductor substrate 12 and undercuts 84 that extend, at an incline towards the semiconductor substrate 12, under the inner sidewall surfaces 86 of the sidewall spacer structures 32, which results from the removal of the inclined outer lateral sections 24 and 26 of the dummy gate insulation layer 18. Removing the dummy gate structure 16 may be done, for example, by means of a first etch process adapted to selectively remove the material of the dummy gate electrode 22 relative to the material or materials of the ILD layer 66, the layer 62 of the encapsulation material 64, and the sidewall spacer structures 32, and a second etch process adapted to selectively remove the material of the dummy gate insulation layer 18 relative to the material of the semiconductor substrate 12.

Figure 20:
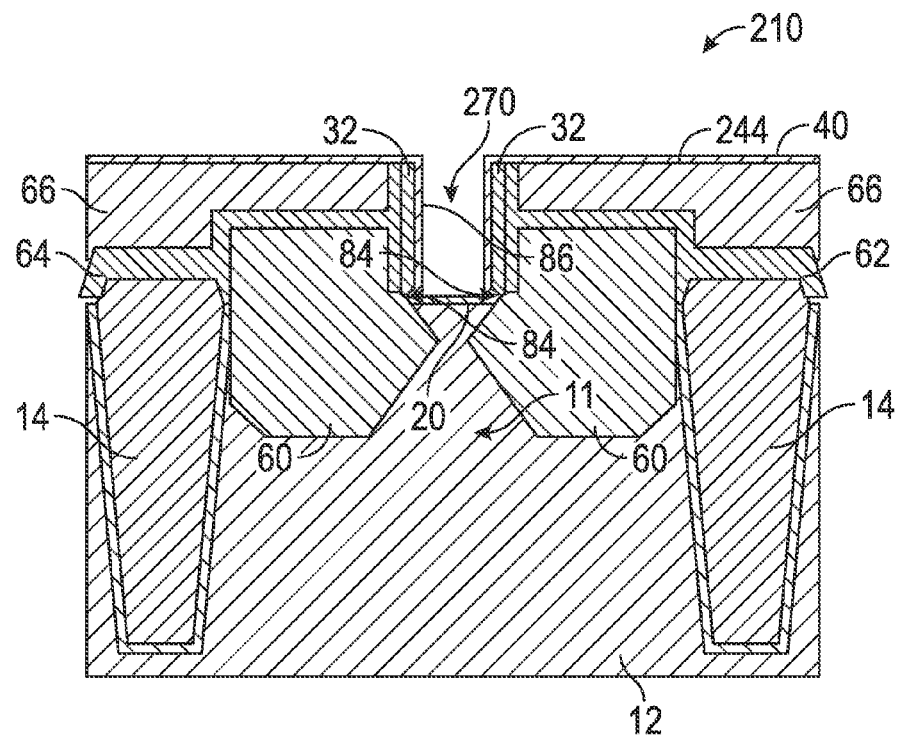
Figure 21:
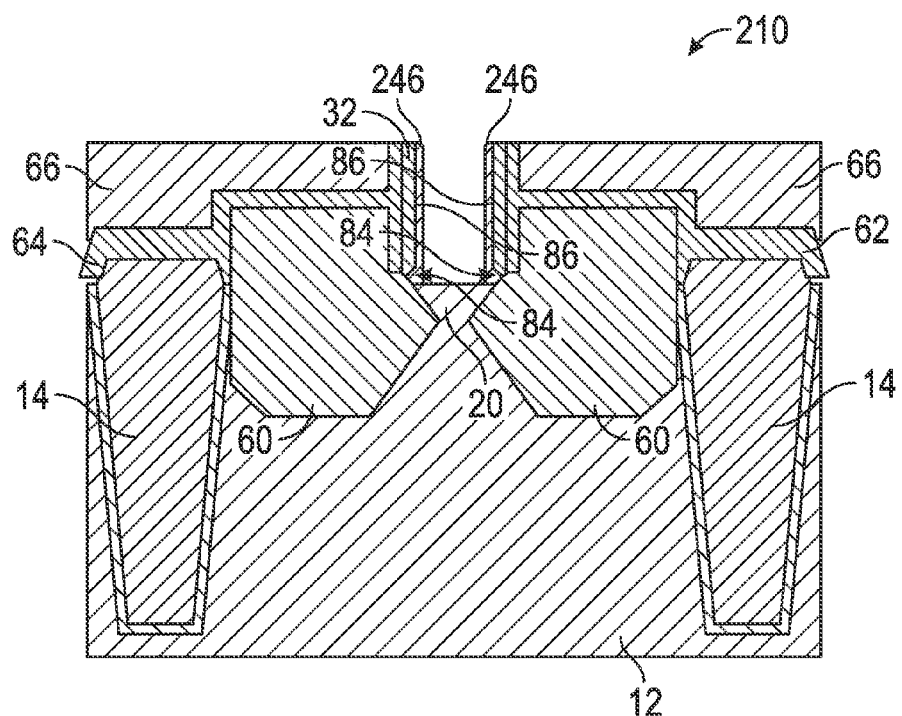

The process continues as illustrated in FIGS. 20-21 by depositing a spacer forming material 40 overlying the ILD layer 66, portions of the layer 62 of the encapsulation material 64, and in the recess 270 including over the inner sidewall surfaces 86, in the undercuts 84, and over the exposed portion of the channel region 20 to form a layer 244 of the spacer forming material 40. As discussed above, in an exemplary embodiment, the spacer forming material 40 is deposited using an ALD process. In an exemplary embodiment, the spacer forming material 40 is a nitride material (e.g., silicon nitride). Alternatively, the spacer forming material 40 may be formed from another insulating or dielectric material(s) known to those skilled in the art, such as, for example, silicon dioxide, or low dielectric (low-k) material or the like.

In an exemplary embodiment, the layer 244 of spacer forming material 40 is selectively etched using an anisotropic etching process to remove portions of the spacer forming material 40 that overlie the ILD layer 66 and the channel region 20 while leaving portions of the spacer forming material 40 along the inner sidewall surfaces 86 of the sidewall spacer structures 32 and in the undercuts 84 intact to form additional sidewall spacer structures 246. As illustrated in FIG. 21, in an exemplary embodiment, the additional sidewall spacer structures 246 have an "L-shaped" cross-section and a mirror image thereof cross-section, respectively.

Figure 22:
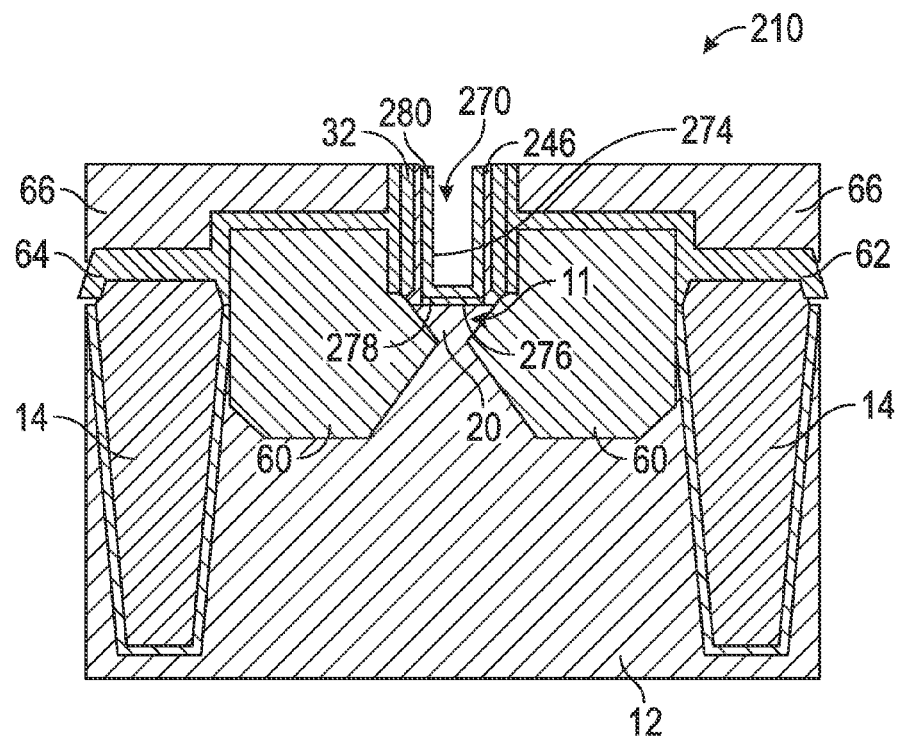

The process continues as illustrated in FIG. 22 by forming a replacement gate structure 274 that includes a high-K dielectric layer 278 and a metal gate 280 in the recess 270. In an exemplary embodiment, the replacement gate structure 274 is formed by depositing a high-K dielectric material 276 overlying the ILD layer 66, inner surfaces of the additional sidewall spacer structures 246, and the exposed portion of the channel region 20 of the semiconductor substrate 12 and selectively etching the high-K dielectric material 276 to form the high-K dielectric layer 278. The high-K dielectric material 276 may be deposited by an ALD process, a CVD process, or the like. In an exemplary embodiment, the high-K dielectric layer 278 has a thickness of from about 0.1 to about 3 nm and the high-K dielectric material 276 includes hafnium oxide, hafnium silicate, zirconium oxide, or hafnium aluminum oxide. In an exemplary embodiment, the high-K dielectric layer 278 is formed of hafnium dioxide ($HfO_2$). In an exemplary embodiment, the high-K dielectric layer 278 is annealed at a temperature of from about 750 to about 950° C.

The metal gate 280 is formed overlying the high-K dielectric layer 278 using one or more deposition processes, such as a physical vapor deposition (PVD) process, CVD process, an ALD process, or the like. Depending upon the desired function of the device, the metal gate 280 may include one or more work function layers, such as a P-type work function metal layer and/or an N-type work function metal layer as are known in the art. A low resistance layer (not shown) of, for example, aluminum (Al) or tungsten (W), may deposited over the metal gate 280 in a remaining portion of the recess 270 using, for example, a CVD process or the like. In an exemplary embodiment, the work function metal layer(s) may include titanium nitride (TiN), titanium aluminum (TiAl), or the like. Additionally, a barrier/liner layer(s) such as titanium nitride/tantalum nitride (TiN/TaN) may be deposited prior to the work function layer. The upper surface of the IC 10 may be planarized by a CMP process. The upper surface of the IC 210 may be planarized by a CMP process. As illustrated, in an exemplary embodiment, the additional sidewall spacer structures 246 is disposed along the inner sidewalls of the sidewall spacer structures 32 extending under the lower portions of the sidewall spacer structures 32 to improve isolation between the metal gate 280 and the strain-inducing regions 60 to help reduce or eliminate the possibility of shorting or loss between the strain-inducing regions 60 and the metal gate 280.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit, the method comprising:
    providing a dummy gate structure overlying a semiconductor substrate, wherein the dummy gate structure comprises a dummy gate insulation layer overlying the semiconductor substrate and a dummy gate electrode overlying the dummy gate insulation layer;
    forming sidewall spacer structures laterally adjacent to the dummy gate structure that overlies the semiconductor substrate;
    removing at least a portion of outer lateral sections of the dummy gate insulation layer to form undercuts that extend under the sidewall spacer structures after forming the sidewall spacer structures;
    forming additional sidewall spacer structures laterally adjacent to the sidewall spacer structures and under lower portions of the sidewall spacer structures, in the undercuts; and
    replacing the dummy gate structure with a replacement gate structure, wherein the additional sidewall spacers remain laterally adjacent to the sidewall spacer structures and under lower portions of the sidewall spacer structures in the resulting integrated circuit.

2. The method of claim 1, wherein the sidewall spacer structures each have an inner sidewall surface that is formed facing the dummy gate structure and an outer sidewall surface that is formed facing away from the dummy gate structure, and wherein forming the additional sidewall spacer structures comprises forming the additional sidewall spacer structures corresponding along and under the outer sidewall surfaces.

3. The method of claim 1, wherein forming the additional sidewall spacer structures comprises forming the additional sidewall spacer structures each having a thickness of from about 1 to about 5 nm.

4. The method of claim 1, wherein forming the additional sidewall spacer structures comprises depositing a spacer forming material laterally adjacent to the sidewall spacer structures using an atomic layer deposition (ALD) process.

5. The method of claim 1, wherein forming the additional sidewall spacer structure comprises:
depositing a spacer forming material along outer sidewall surfaces of the sidewall spacer structures and in the undercuts for forming the additional sidewall spacer structures disposed laterally adjacent to the sidewall spacer structures and under the lower portions of the sidewall spacer structures, and wherein the method further comprises:
forming cavities in the semiconductor substrate laterally adjacent to the additional sidewall spacer structures on sides opposite to the sidewall spacer and dummy gate structures; and
depositing a strain-inducing material in the cavities to form strain-inducing regions, and wherein replacing the dummy gate structure comprises:
removing the dummy gate structure to form a recess between the sidewall spacer structures; and
forming the replacement gate structure in the recess.

6. The method of claim 5, wherein forming the sidewall spacer structures comprises forming the sidewall spacer structures such that sidewalls of the dummy gate electrode are covered by the sidewall spacer structures and the at least portions of the outer lateral sections of the dummy gate insulation layer are exposed.

7. The method of claim 6, wherein the sidewall spacer structures comprise a nitride material and the dummy gate insulation layer comprises an oxide material, and wherein removing the at least the portion of the outer lateral sections of the dummy gate insulation layer comprises exposing the at least the portion of the outer lateral sections to a selective etching process that favors removing the oxide material over removing the nitride material.

8. The method of claim 5, wherein depositing the spacer forming material comprises:
depositing the spacer forming material overlying the semiconductor substrate and the sidewall spacer structures; and
anisotropically etching the spacer forming material to remove portions of the spacer forming material that overlie the semiconductor substrate while leaving remaining portions of the spacer forming material along the outer sidewall surfaces of the sidewall spacer structures and in the undercuts to form the additional sidewall spacer structures.

9. The method of claim 5, wherein depositing the strain-inducing material comprises selectively depositing the strain-inducing material into the cavities using an epitaxial growth process.

10. The method of claim 5, further comprising:
depositing an interlayer dielectric (ILD) layer overlying the strain-inducing regions, the sidewall spacer structures, and the additional sidewall spacer structures; and
planarizing the ILD layer, the sidewall spacer structures, and the additional sidewall spacer structures with the dummy gate structure to expose an upper surface of the dummy gate structure, and wherein removing the dummy gate structure comprises exposing the upper surface of the dummy gate structure to an etching process to form the recess.

11. The method of claim 5, wherein the semiconductor substrate has an oxide layer formed thereon, and wherein providing the dummy gate structure comprises:
forming the dummy gate electrode overlying the oxide layer using a patterned hard mask layer; and
selectively etching the oxide layer using the patterned hard mask layer and the dummy gate electrode has an etch mask to form the dummy gate insulation layer.

12. A method for fabricating an integrated circuit, the method comprising:
providing a dummy gate structure overlying a semiconductor substrate, wherein the dummy gate structure comprises a dummy gate insulation layer overlying the semiconductor substrate and a dummy gate electrode overlying the dummy gate insulation layer;
forming sidewall spacer structures laterally adjacent to the dummy gate structure that overlies the semiconductor substrate;
removing at least a portion of outer lateral sections of the dummy gate insulation layer to form undercuts that extend under the sidewall spacer structures after forming the sidewall spacer structures;
forming additional sidewall spacer structures laterally adjacent to the sidewall spacer structures and under lower portions of the sidewall spacer structures, in the undercuts; and replacing the dummy gate structure with a replacement gate structure, and wherein forming the additional sidewall spacer structures comprises forming at least one of the additional sidewall spacer structures having an "L-shaped" cross-section.

13. The method of claim 12, wherein forming the additional sidewall spacer structures comprises forming the at least one of the additional sidewall spacer structures having the "L-shaped" cross-section with a leg portion and a foot portion that extends from the leg portion a distance of from about 1 to about 5 nm.

14. A method for fabricating an integrated circuit, the method comprising:
providing a dummy gate structure overlying a semiconductor substrate, wherein the dummy gate structure comprises a dummy gate insulation layer overlying the semiconductor substrate and a dummy gate electrode overlying the dummy gate insulation layer;
forming sidewall spacer structures laterally adjacent to the dummy gate structure that overlies the semiconductor substrate;
removing at least a portion of outer lateral sections of the dummy gate insulation layer to form undercuts that extend under the sidewall spacer structures after forming the sidewall spacer structures;
forming additional sidewall spacer structures laterally adjacent to the sidewall spacer structures and under lower portions of the sidewall spacer structures, in the undercuts; and replacing the dummy gate structure with a replacement gate structure, and wherein the method further comprises depositing a layer of encapsulation material overlying the additional sidewall spacer structures that are laterally adjacent to the sidewall spacer structures and under lower portions of the sidewall spacer structures.

* * * * *